(12) United States Patent
Yang et al.

(10) Patent No.: US 11,790,754 B2
(45) Date of Patent: Oct. 17, 2023

(54) MAINTENANCE-FREE COOLING DEVICE

(71) Applicant: Siemens Healthcare GmbH, Erlangen (DE)

(72) Inventors: Hai Ning Yang, Guangdong (CN); Yun Long Han, Shenzhen (CN); Yu wen Luo, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 271 days.

(21) Appl. No.: 17/377,546

(22) Filed: Jul. 16, 2021

(65) Prior Publication Data

US 2022/0020259 A1 Jan. 20, 2022

(30) Foreign Application Priority Data

Jul. 16, 2020 (CN) .......................... 202010686843.7

(51) Int. Cl.
*G08B 21/18* (2006.01)
*G01M 99/00* (2011.01)
*G01R 33/38* (2006.01)
*G01R 33/3815* (2006.01)

(52) U.S. Cl.
CPC ......... *G08B 21/187* (2013.01); *G01M 99/005* (2013.01); *G01R 33/3804* (2013.01); *G01R 33/3815* (2013.01)

(58) Field of Classification Search
CPC ............... G08B 21/187; G01M 99/005; G01R 33/3804; G01R 33/3815
See application file for complete search history.

(56) References Cited

U.S. PATENT DOCUMENTS

| | | | | |
|---|---|---|---|---|
| 4,487,058 | A * | 12/1984 | Mennenga | G01M 3/226 73/40 |
| 6,253,557 | B1 * | 7/2001 | Credle, Jr. | F25D 21/02 62/139 |
| 2005/0043761 | A1 | 2/2005 | Connelly et al. | |
| 2009/0281677 | A1* | 11/2009 | Botich | G06Q 10/00 705/400 |
| 2017/0025814 | A1* | 1/2017 | Xiong | H01S 3/06754 |
| 2022/0020259 | A1* | 1/2022 | Yang | G01R 33/3804 |

FOREIGN PATENT DOCUMENTS

CN 203693595 U 7/2014
CN 110552861 A 12/2019

* cited by examiner

*Primary Examiner* — Hoi C Lau
(74) *Attorney, Agent, or Firm* — Banner & Witcoff Ltd.

(57) ABSTRACT

A system for monitoring a helium compressor and a magnetic resonance imaging device may include photoelectric converter configured to monitor a status current of a helium compressor; a dry contact signal converter having a dry contact switch and a signal converter. The dry contact switch may include a first pair of switch contacts connected to an output of the photoelectric converter and a second pair of switch contacts connected to an output voltage of the helium compressor. The signal converter may be configured to collect an action signal of the dry contact switch, and convert corresponding fault information into a network signal and send the same to a network server. Personnel may be notified of the fault information in a preset communication mode using a preset communication address.

8 Claims, 3 Drawing Sheets

MAINTENANCE-FREE COOLING DEVICE

CROSS REFERENCE TO RELATED APPLICATIONS

This patent application claims priority to Chinese Patent Application No. 202010686843.7, filed Jul. 16, 2020, which is incorporated herein by reference in its entirety.

BACKGROUND

Technical Field

The present disclosure relates to the field of medical devices, and in particular to a system and method for monitoring a helium compressor and a magnetic resonance imaging device.

Related Art

During the operation of a superconducting magnetic resonance imaging (MRI) system, when the MRI system is powered off, in order to keep a magnet working in a superconducting state, a helium compressor is required to work continuously for 7×24 H to ensure that helium provided by the compressor circulates magnet heat back to the compressor, and the heat is taken away by a water cooler, thereby maintaining an internal temperature of the magnet at about 4.2 K.

During the operation of the helium compressor, various external supporting components, such as the water cooler providing refrigeration for the helium compressor and a power supply system supplying power to the helium compressor, and the compressor itself may cause a halt of the helium compressor for various reasons. When the helium compressor is halted for about two hours, pressure on the superconducting magnet may be too high due to temperature rise, resulting in leakage of liquid helium and unavailability of the MRI system. If the helium compressor is halted at night or during legal holidays, which fails to be found by the MRI system maintenance personnel in time, it may cause the quenching of the superconducting magnet and the loss of a large amount of liquid helium. Since the liquid helium is rare gas and expensive, each quench may bring great economic losses and long downtime to customers.

For this reason, some users have to arrange regular inspections, comprising inspections at night or during legal holidays, to find out problems of the helium compressor in time as much as possible.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
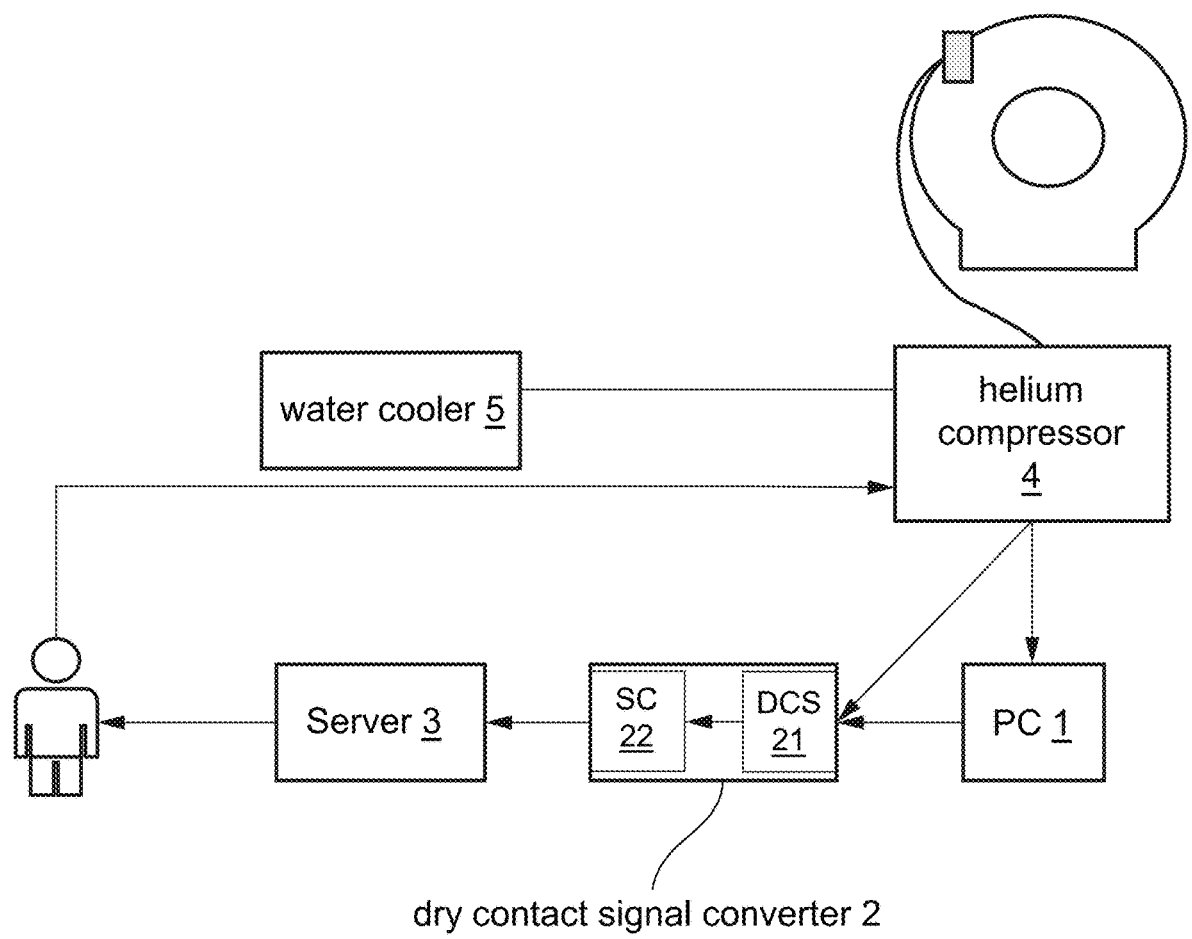
FIG. 1 is a schematic structural diagram of a system for monitoring a helium compressor according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure it to provide a system for monitoring a helium compressor and a magnetic resonance imaging device, and to provide a method for monitoring a helium compressor, to realize real-time monitoring of a helium compressor.

The embodiments of the present disclosure propose a system for monitoring a helium compressor, the system comprising: a photoelectric converter configured to monitor a status current of a helium compressor, output a first level signal when the status current is normally output, and output a second level signal when the status current is interrupted; a dry contact signal converter comprising a dry contact switch and a signal converter, wherein the dry contact switch comprises a first pair of switch contacts and a second pair of switch contacts, the first pair of switch contacts being connected to an output of the photoelectric converter and acting when a connected level signal changes from the first level signal to the second level signal, and the second pair of switch contacts being connected to an output voltage signal of the helium compressor and acting when the output voltage changes from a third level signal to a fourth level signal; and the signal converter is configured to collect an action signal of the dry contact switch, and convert corresponding fault information when the first pair of switch contacts act into a network signal and send same to a network server when the first pair of switch contacts act, or convert corresponding fault information when the second pair of switch contacts act into a network signal and send same to the network server when the second pair of switch contacts act; and the network server is configured to notify corresponding maintenance personnel of the fault information in a preset communication mode and by means of a preset communication address when receiving the network signal of the fault information.

In one implementation, the corresponding fault information when the first pair of switch contacts act comprises: a halt of the compressor caused by an internal error of the helium compressor; and the corresponding fault information when the second pair of switch contacts act comprises: a power failure of the compressor caused by a stop of power supply or switch-off of the helium compressor.

In one implementation, the preset communication mode and communication address comprise: at least one communication mode among a mail, a short message service, and WeChat and a corresponding communication address thereof.

The embodiments of the present disclosure propose a magnetic resonance imaging device, comprising the system for monitoring a helium compressor described in any one of the above implementations.

The embodiments of the present disclosure propose a method for monitoring a helium compressor, the method comprising: using a photoelectric converter to monitor a status current of a helium compressor, outputting, by the photoelectric converter, a first level signal when the status current is normally output, and outputting, by the photoelectric converter, a second level signal when the status current is interrupted; connecting a first pair of switch contacts comprised in a dry contact switch to an output of the photoelectric converter, acting, by the first pair of switch contacts, when a connected level signal changes from the first level signal to the second level signal, connecting a second pair of switch contacts comprised in the dry contact switch to an output voltage signal of the helium compressor, and acting, by the second pair of switch contacts, when the output voltage changes from a third level signal to a fourth level signal; using a signal converter to collect an action signal of the dry contact switch, and converting corresponding fault information when the first pair of switch contacts act into a network signal and sending same to a network server when the first pair of switch contacts act, or converting corresponding fault information when the second pair of switch contacts act into a network signal and sending same to the network server when the second pair of switch contacts act; and using the network server to notify corresponding maintenance personnel of the fault information in the received network signal in a preset communication mode and by means of a preset communication address.

In one implementation, the corresponding fault information when the first pair of switch contacts act comprises: a halt of the compressor caused by an internal error of the helium compressor; and the corresponding fault information when the second pair of switch contacts act comprises: a power failure of the compressor caused by a stop of power supply or switch-off of the helium compressor.

In one implementation, the preset communication mode and communication address comprise: at least one communication mode among a mail, a short message service, and WeChat and a corresponding communication address thereof.

It can be learned from the above solution that in the embodiments of the present disclosure, the photoelectric converter and the dry contact signal converter are used to monitor the status current of the helium compressor, and it may be known that, when the status current is interrupted, the halt of the helium compressor is caused by an internal problem of the helium compressor. The dry contact signal converter is used to monitor an output voltage of the helium compressor, and it may be known that, when the output voltage is interrupted, the halt of the helium compressor is caused by the stop of the power supply or the switch-off of the helium compressor. Therefore, a fault type may be monitored. Moreover, because the monitoring is real-time monitoring, the loss of liquid helium and system downtime caused by a failure to find the halt of the helium compressor in time may be reduced, and a problem of delayed maintenance caused by a failure to determine a specific fault may be reduced. In addition, because of the real-time automatic monitoring, there is no need to arrange the maintenance personnel to attend at night or on holidays, thereby reducing the labor cost, and avoiding the loss of customers and companies through the real-time monitoring of a liquid helium compressor.

In embodiments of the present disclosure, in order to implement real-time monitoring of a status of a helium compressor and solve problems of manpower consumption, delay, etc. caused by manual attendance, different signals are monitored for different reasons causing a halt of the helium compressor, for example, an output voltage signal of the helium compressor may be monitored for a power failure of the compressor caused by a stop of power supply, switch-off of the helium compressor, etc. while the status current of the helium compressor may be monitored for the halt of the compressor caused by internal errors such as too high a water temperature when the power supply of the compressor is normal. Herein, considering that when the output voltage of the helium compressor decreases to zero, a switching action of a relay may be directly driven, the output voltage of the helium compressor may be directly connected to a dry contact switch. However, the status current is usually small, for example, 20 mA, and therefore, the current is not enough to directly drive the relay to act. Therefore, a photoelectric converter may be used to monitor the status current, electrical-optical-electrical conversion is implemented by means of the photoelectric converter, and then an output change of the photoelectric converter is used to drive a switching action of the dry contact switch.

In order to make the object, technical solutions, and advantages of the present disclosure more apparent, the present disclosure will be described in further detail by way of embodiments hereinafter.

Figure 2:
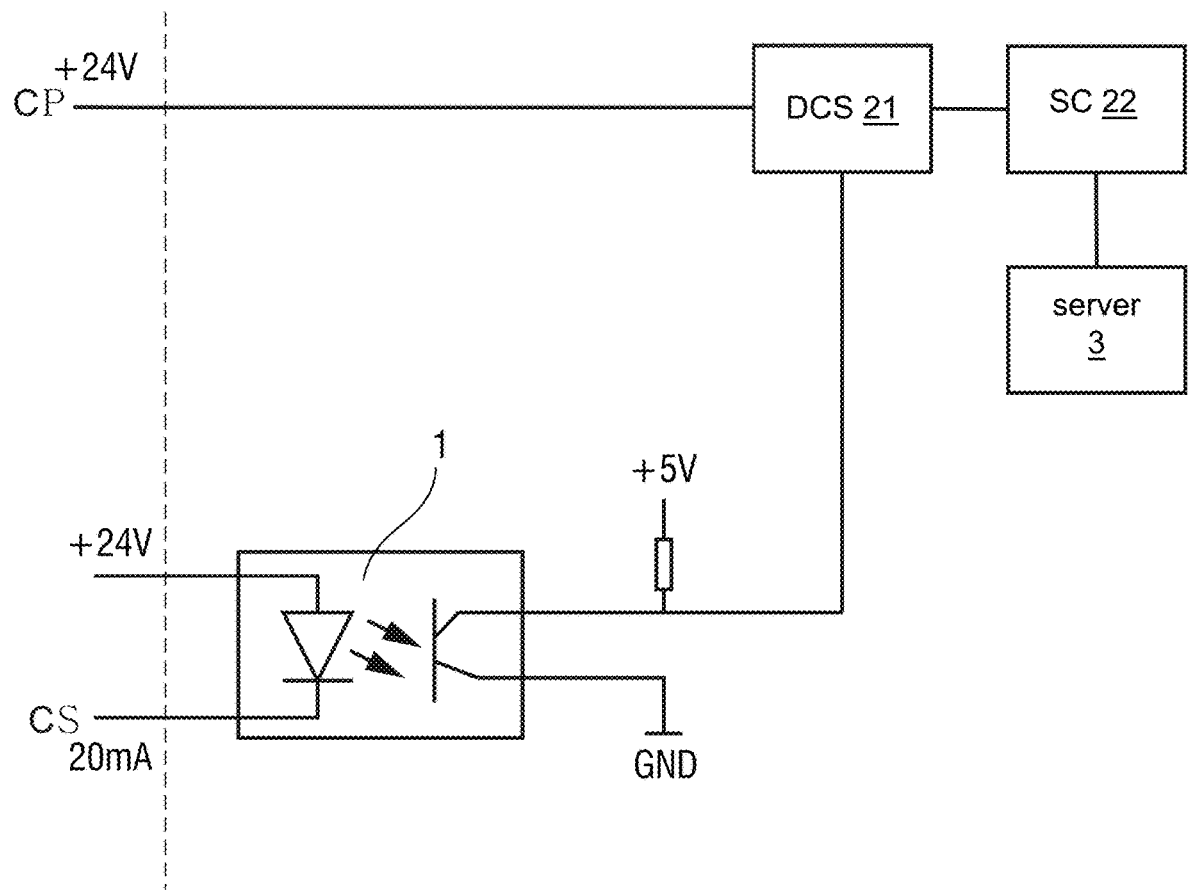
FIG. 2 is a schematic diagram of a connection relation between parts according to an exemplary embodiment for an example implementation in FIG. 1.

FIG. 1 is a schematic structural diagram of a system for monitoring a helium compressor according to an embodiment of the present disclosure. FIG. 2 is a schematic diagram of a connection relation between parts according to a specific implementation example in FIG. 1. As shown in FIGS. 1 and 2, the system for monitoring a helium compressor may comprise: a photoelectric converter 1, a dry contact signal converter 2, and a network server 3. In an exemplary embodiment, the system for monitoring a helium compressor includes processing circuitry that is configured to perform one or more functions and/or operations of the system. In one or more embodiments, one or more of the components of the system (e.g. photoelectric converter 1, dry contact signal converter 2, server 3, helium compressor 4, water cooler 5) includes processing circuitry configured to perform the respective functions and/or operations of the component(s).

The photoelectric converter 1 is configured to monitor a status current (CS) of a helium compressor 4, for example, a current of 20 mA as shown in FIG. 2; when the helium compressor works normally, that is, when the status current is output normally, an optocoupler in the photoelectric converter 1 works normally, an LED lamp at an input terminal is turned on, in this case, a transistor at an output terminal is conducted, and the photoelectric converter 1 outputs a first level signal, for example, a 5 V-voltage signal as shown in FIG. 2; and when the helium compressor 4 is normal in power supply but in a halt state, that is, when the status current is interrupted, the optocoupler in the photoelectric converter 1 does not work, the LED lamp at the input terminal is turned off, in this case, the transistor at the output terminal is cut off, and the photoelectric converter 1 outputs a second level signal, for example, a 0 V-voltage signal as shown in FIG. 2.

The dry contact signal converter 2 comprises: a dry contact switch 21 and a signal converter 22. The dry contact switch 21 comprises two pairs of switch contacts. In an exemplary embodiment, a first pair of switch contacts are connected to an output of the photoelectric converter 1 and act when a connected level signal changes from the first level signal to the second level signal, and a second pair of switch contacts are connected to an output voltage (CP) of the helium compressor 4. When the helium compressor 4 works normally, that is, when the output voltage is output normally, the second pair of switch contacts are connected to a third level signal, such as a high level signal, for example, a 24 V-voltage signal as shown in FIG. 2; and when the power supply of the helium compressor 4 is stopped or the helium compressor 4 is switched off, the output voltage is interrupted, the second pair of switch contacts are connected to a fourth level signal, such as a low level signal, for example, a 0 V-voltage signal as shown in FIG. 2, and the second pair of switch contacts act. The signal converter 22 is configured to collect an action signal of the dry contact switch 21, and convert corresponding fault information when the first pair of switch contacts act into a network signal and send same to the network server 3 when the first pair of switch contacts act; or convert corresponding fault information when the second pair of switch contacts act into a network signal and send same to the network server 3 when the second pair of switch contacts act. The corresponding fault information when the first pair of switch contacts act comprises: the halt of the helium compressor 4 caused by internal errors of the helium compressor 4, such as too high a water temperature of a water cooler 5. The corresponding fault information when the second pair of switch contacts act comprises: the power failure of the helium compressor 4 caused by the stop of the power supply, the switch-off of the helium compressor 4, etc.

The network server 3 is configured to generate a notification to notify corresponding maintenance personnel of the fault information in a preset communication mode and by means of a preset communication address when receiving the network signal of the fault information. For example, the corresponding maintenance personnel is notified by means of at least one of a mail, a short message service, WeChat, etc.

Aspects of the present disclosure further include a magnetic resonance imaging device that includes the system for monitoring a helium compressor described herein.

Figure 3:
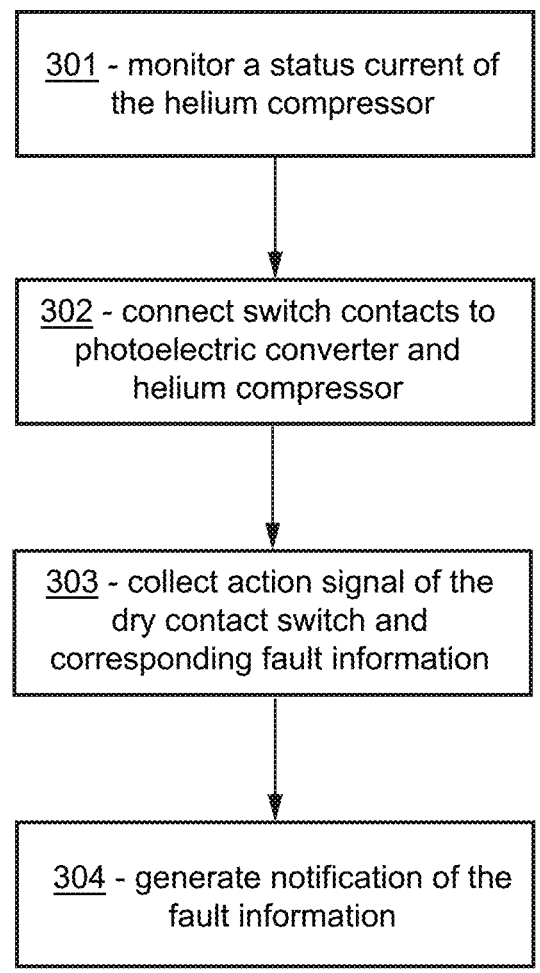
FIG. 3 is a flowchart of a method for monitoring a helium compressor according to an exemplary embodiment of the present disclosure.

FIG. 3 is a flowchart of a method for monitoring a helium compressor according to an embodiment of the present disclosure. As shown in FIG. 3, the method may comprise the steps as follows:

Step 301, a photoelectric converter is used to monitor a status current of the helium compressor, the photoelectric converter outputs a first level signal when the status current is normally output, and the photoelectric converter outputs a second level signal when the status current is interrupted.

Step 302, a first pair of switch contacts comprised in a dry contact switch are connected to an output of the photoelectric converter, the first pair of switch contacts act when a connected level signal changes from the first level signal, such as a high level signal, to the second level signal, such as a low level signal, a second pair of switch contacts comprised in the dry contact switch are connected to an output voltage signal of the helium compressor, and the second pair of switch contacts act when the output voltage signal changes from a third level signal, such as a high level signal, to a fourth level signal, such as a low level signal.

Step 303, a signal converter is used to collect an action signal of the dry contact switch, and corresponding fault information when the first pair of switch contacts act is converted into a network signal and sent to a network server when the first pair of switch contacts act, or corresponding fault information when the second pair of switch contacts act is converted into a network signal and sent to the network server when the second pair of switch contacts act, wherein the corresponding fault information when the first pair of switch contacts act comprises:

a halt of the compressor caused by an internal error of the helium compressor; and the corresponding fault information when the second pair of switch contacts act comprises: a power failure of the compressor caused by a stop of power supply or switch-off of the helium compressor.

Step 304, the network server is used to notify corresponding maintenance personnel of the fault information in the received network signal in a preset communication mode and by means of a preset communication address. The preset communication mode and communication address may include: at least one communication mode (e.g. a mail (e-mail) service, a short message service (SMS), and a digital messaging service (e.g. WeChat, iMessage, etc.)) and a corresponding communication address thereof.

In exemplary embodiments of the present disclosure, the photoelectric converter and the dry contact signal converter are used to monitor the status current of the helium compressor. When the status current is interrupted, the halt of the helium compressor is caused by an internal problem of the helium compressor. The dry contact signal converter is used to monitor an output voltage of the helium compressor. The output voltage is interrupted, the halt of the helium compressor is caused by the stop of the power supply or the switch-off of the helium compressor. Therefore, a fault type may be monitored. Moreover, because the monitoring is real-time monitoring, the loss of liquid helium and system downtime caused by a failure to find the halt of the helium compressor in time may be reduced, and a problem of delayed maintenance caused by a failure to determine a specific fault may be reduced. In addition, because of the real-time automatic monitoring, there is no need to arrange the maintenance personnel to attend at night or on holidays, thereby reducing the labor cost, and avoiding the loss of customers and companies through the real-time monitoring of a liquid helium compressor.

The above description is only the preferred embodiments of the present disclosure and is not intended to limit the present disclosure. Any modifications, equivalent substitutions, improvements, etc. made within the spirit and principles of the present disclosure shall fall within the scope of protection of the present disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

| Reference List | |
|---|---|
| 1 | Photoelectric converter |
| 2 | Dry contact signal converter |
| 21 | Dry contact switch |
| 22 | Signal converter |
| 3 | Network server |
| 4 | Helium compressor |
| 5 | Water cooler |
| 301 to 304 | operations |

The invention claimed is:

1. A system for monitoring a helium compressor, the system comprising:
a photoelectric converter configured to: monitor a status current of a helium compressor, output a first level signal in response to the status current being output, and output a second level signal in response to the status current being interrupted;
a dry contact signal converter including:
a dry contact switch having: a first pair of switch contacts and a second pair of switch contacts, the first pair of switch contacts being connected to an output of the photoelectric converter and being configured to act in response to a connected level signal changing from the first level signal to the second level signal, and the second pair of switch contacts being connected to an output voltage signal of the helium compressor and being configured to act in response to the output voltage signal changes from a third level signal to a fourth level signal; and
a signal converter configured to: collect an action signal of the dry contact switch, and:
in response to the first pair of switch contacts acting into a network signal, convert fault information corresponding to the first pair of switch contacts and send the converted first pair fault information to a network server; and
in response to the second pair of switch contacts acting into the network signal, convert fault information corresponding to the second pair of switch contacts and send the converted second pair fault information to the network server; and
the network server configured to generate a notification to notify corresponding maintenance personnel of the fault information in a preset communication mode and using a preset communication address in response to receiving the network signal of the fault information.

2. The system for monitoring a helium compressor as claimed in claim 1, wherein:
the corresponding fault information associated with the first pair of switch contacts act comprises: a halt of the compressor caused by an internal error of the helium compressor; and the corresponding fault information associated with the second pair of switch contacts act comprises: a power failure of the compressor caused by a stop of power supply or switch-off of the helium compressor.

3. The system for monitoring a helium compressor as claimed in claim 1, wherein the preset communication mode and communication address comprise: at least one communication mode among a mail, a short message service, and WeChat and a corresponding communication address thereof.

4. A magnetic resonance imaging device, comprising the system for monitoring a helium compressor as claimed in claim 1.

5. A method for monitoring a helium compressor, the method comprising:
   monitoring a status current of a helium compressor using a photoelectric converter, wherein the photoelectric converter is configured to: output a first level signal in response to the status current being output, and output a second level signal in response to the status current being interrupted;
   connecting a first pair of switch contacts of a dry contact switch to an output of the photoelectric converter in response to a connected level signal changing from the first level signal to the second level signal, and connecting a second pair of switch contacts of the dry contact switch to an output voltage signal of the helium compressor in response to the output voltage signal changes from a third level signal to a fourth level signal;
   collecting an action signal of the dry contact switch, using a signal converter;
   in response to the first pair of switch contacts acting into a network signal, converting fault information associated with the first pair of switch contacts and sending the converted fault information associated with the first pair of switch contacts to a network server;
   in response to the second pair of switch contacts acting into the network signal, converting fault information associated with the second pair of switch contacts and sending the converted fault information associated with the second pair of switch contacts to the network server; and
   generating a notification, using the network server, to notify corresponding maintenance personnel of the fault information in the received network signal in a preset communication mode and using a preset communication address.

6. The method for monitoring a helium compressor as claimed in claim 5, wherein the corresponding fault information associated with the first pair of switch contacts act comprises: a halt of the compressor caused by an internal error of the helium compressor; and
   the corresponding fault information associated with the second pair of switch contacts act comprises: a power failure of the compressor caused by a stop of power supply or switch-off of the helium compressor.

7. The method for monitoring a helium compressor as claimed in claim 5, wherein the preset communication mode and communication address comprise: at least one communication mode among a mail, a short message service, and WeChat and a corresponding communication address thereof.

8. A non-transitory computer-readable storage medium with an executable program stored thereon, that when executed, instructs a processor to perform the method of claim 5.

* * * * *